United States Patent
Cook

(10) Patent No.: US 12,260,895 B2
(45) Date of Patent: Mar. 25, 2025

(54) APPARATUS WITH POWER-BASED DATA PROTECTION MECHANISM AND METHODS FOR OPERATING THE SAME

(71) Applicant: Micron Technology, Inc., Boise, ID (US)

(72) Inventor: Bryce D. Cook, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/464,671

(22) Filed: Sep. 1, 2021

(65) Prior Publication Data

US 2023/0061037 A1    Mar. 2, 2023

(51) Int. Cl.
| | | |
|---|---|---|
| G11C 11/4078 | (2006.01) | |
| G11C 11/406 | (2006.01) | |
| G11C 11/4091 | (2006.01) | |
| G11C 29/38 | (2006.01) | |

(52) U.S. Cl.
CPC ........ *G11C 11/4078* (2013.01); *G11C 11/406* (2013.01); *G11C 11/4091* (2013.01); *G11C 29/38* (2013.01)

(58) Field of Classification Search
CPC .............. G11C 11/4078; G11C 11/406; G11C 11/4091; G11C 29/38
USPC .............................................. 365/149, 185.22
See application file for complete search history.

(56) References Cited

U.S. PATENT DOCUMENTS

| | | | | |
|---|---|---|---|---|
| 4,972,175 A * | 11/1990 | MacPherson | ........... | G06F 21/87 109/42 |
| 6,219,788 B1 * | 4/2001 | Flavin | .................... | G06Q 30/02 726/28 |
| 6,731,536 B1 * | 5/2004 | McClain | .................. | G11C 7/24 365/185.04 |
| 6,822,899 B1 * | 11/2004 | Boulos | ................. | G11C 16/225 365/185.23 |
| 8,458,804 B1 * | 6/2013 | Hyde | ..................... | G11C 5/005 726/26 |
| 8,925,098 B2 * | 12/2014 | Hyde | .................. | G06F 12/0238 713/193 |
| 9,225,695 B1 * | 12/2015 | Riera | .................... | H04L 63/101 |
| 9,858,208 B2 * | 1/2018 | Connolly | ............ | G06F 12/1466 |
| 9,940,457 B2 * | 4/2018 | Healy | ................... | G06F 11/073 |
| 9,996,281 B2 * | 6/2018 | Sharon | ................. | G11C 16/26 |
| 10,037,045 B2 * | 7/2018 | Wan | ........................ | G05F 1/463 |
| 10,249,349 B2 * | 4/2019 | Takizawa | ............... | G11C 16/26 |
| 10,446,226 B2 * | 10/2019 | Tortorelli | ........... | G11C 13/0069 |
| 10,564,900 B2 * | 2/2020 | Achtenberg | ........ | G06F 11/1068 |
| 10,692,561 B2 * | 6/2020 | Jang | .................. | G11C 11/40603 |
| 10,928,870 B2 * | 2/2021 | Chang | ................ | G11C 16/3495 |

(Continued)

FOREIGN PATENT DOCUMENTS

| | | | | | |
|---|---|---|---|---|---|
| BR | 102012022504 A2 * | 10/2014 | ......... | G03G 15/0863 |
| CA | 2754230 A1 * | 3/2012 | ........... | G06F 21/554 |

(Continued)

*Primary Examiner* — Michael T Tran
(74) *Attorney, Agent, or Firm* — Perkins Coie LLP

(57) ABSTRACT

Methods, apparatuses and systems related to protecting an apparatus against unauthorized accesses or usages are described. The apparatus may include a data protection circuit that protects an operating state of the apparatus, data stored in the apparatus, or a combination thereof when a temperature of the apparatus is outside of an operating range thereof.

17 Claims, 5 Drawing Sheets

(56) References Cited

U.S. PATENT DOCUMENTS

| | | | | |
|---|---|---|---|---|
| 11,017,823 B1* | 5/2021 | Kamepalli | | G06F 1/206 |
| 11,036,413 B1* | 6/2021 | Sloat | | G06F 1/206 |
| 11,081,167 B1* | 8/2021 | Yabe | | G11C 7/065 |
| 11,094,365 B1* | 8/2021 | Jang | | G06F 9/30047 |
| 11,200,939 B1* | 12/2021 | Rehmeyer | | G11C 11/40626 |
| 11,385,984 B2* | 7/2022 | Yang | | G06F 11/3058 |
| 11,923,019 B2* | 3/2024 | Jia | | G11C 16/24 |
| 2004/0025031 A1* | 2/2004 | Ooi | | G06F 21/32 |
| | | | | 713/186 |
| 2005/0125597 A1* | 6/2005 | Lovett | | G11C 11/406 |
| | | | | 711/106 |
| 2007/0013538 A1* | 1/2007 | Dalzell | | G08B 13/128 |
| | | | | 340/652 |
| 2009/0057767 A1* | 3/2009 | Takahashi | | H01L 27/105 |
| | | | | 257/357 |
| 2009/0187753 A1* | 7/2009 | Gelman | | G06F 9/3863 |
| | | | | 713/2 |
| 2009/0327633 A1* | 12/2009 | Fusella | | G06F 21/79 |
| | | | | 711/E12.091 |
| 2010/0169671 A1* | 7/2010 | Coussieu | | G06F 21/75 |
| | | | | 713/193 |
| 2010/0309734 A1* | 12/2010 | Ehrenreich | | G11C 29/028 |
| | | | | 365/189.07 |
| 2011/0280086 A1* | 11/2011 | Choi | | G11C 7/1048 |
| | | | | 365/191 |
| 2012/0033502 A1* | 2/2012 | Eun | | G11C 11/5628 |
| | | | | 365/185.18 |
| 2012/0079593 A1* | 3/2012 | Adams | | G06F 21/554 |
| | | | | 726/23 |
| 2012/0179952 A1* | 7/2012 | Tuyls | | H04L 9/0866 |
| | | | | 711/E12.078 |
| 2013/0051127 A1* | 2/2013 | Parris | | G11C 11/4096 |
| | | | | 365/149 |
| 2013/0061097 A1* | 3/2013 | Mendel | | G06F 21/54 |
| | | | | 714/47.1 |
| 2013/0232571 A1* | 9/2013 | Belesiu | | G06F 1/26 |
| | | | | 726/21 |
| 2013/0326206 A1* | 12/2013 | Lueck | | G06F 1/32 |
| | | | | 713/1 |
| 2014/0108786 A1* | 4/2014 | Kreft | | G06Q 20/3825 |
| | | | | 713/194 |
| 2014/0208109 A1* | 7/2014 | Narendra Trivedi | | G06F 21/78 |
| | | | | 713/170 |
| 2014/0215613 A1* | 7/2014 | Kelley | | G06F 21/86 |
| | | | | 726/23 |
| 2014/0223120 A1* | 8/2014 | Franceschini | | G06F 21/62 |
| | | | | 711/162 |
| 2015/0161392 A1* | 6/2015 | Krummel | | G06F 21/575 |
| | | | | 726/22 |
| 2015/0228328 A1* | 8/2015 | Cordero | | G11C 11/406 |
| | | | | 365/189.011 |
| 2015/0356300 A1* | 12/2015 | Teglia | | G06F 21/71 |
| | | | | 726/22 |
| 2016/0118104 A1* | 4/2016 | Guz | | G11C 11/4072 |
| | | | | 365/203 |
| 2016/0224412 A1* | 8/2016 | Healy | | G06F 11/1024 |
| 2016/0239663 A1* | 8/2016 | Healy | | G06F 11/076 |
| 2016/0277025 A1* | 9/2016 | Tanamoto | | H03K 3/84 |
| 2016/0291891 A1* | 10/2016 | Cheriton | | G06F 3/064 |
| 2016/0379705 A1* | 12/2016 | Lu | | G11C 11/4094 |
| | | | | 365/149 |
| 2017/0103236 A1* | 4/2017 | Homayoun, Jr. | | G06F 21/87 |
| 2017/0109527 A1* | 4/2017 | Kim | | G11C 16/08 |
| 2017/0255403 A1* | 9/2017 | Sharon | | G06F 3/064 |
| 2018/0013211 A1* | 1/2018 | Ricci | | B60L 53/00 |
| 2018/0090992 A1* | 3/2018 | Shrivastava | | H02J 50/20 |
| 2018/0166116 A1* | 6/2018 | Krilic | | G11C 11/419 |
| 2018/0197599 A1* | 7/2018 | Choi | | G11C 14/0009 |
| 2018/0206177 A1* | 7/2018 | Daoura | | H04W 4/80 |
| 2018/0210540 A1* | 7/2018 | Wang | | G11C 13/0069 |
| 2018/0349647 A1* | 12/2018 | Morgner | | G06F 21/74 |
| 2019/0056999 A1* | 2/2019 | Foxworth | | G11C 7/20 |
| 2019/0065082 A1* | 2/2019 | Penney | | G06F 3/0683 |
| 2019/0068873 A1* | 2/2019 | Rodriguez, II | | G02B 27/0101 |
| 2019/0227949 A1* | 7/2019 | Bernat | | G06F 11/3476 |
| 2019/0325141 A1* | 10/2019 | Liew | | G06F 21/575 |
| 2019/0325142 A1* | 10/2019 | Trikalinou | | G06F 21/575 |
| 2020/0051473 A1* | 2/2020 | Kwon | | G11C 17/18 |
| 2020/0058341 A1* | 2/2020 | Villa | | G11C 11/2255 |
| 2020/0089149 A1* | 3/2020 | Antonio | | G03G 21/1892 |
| 2020/0104219 A1* | 4/2020 | Linnen | | G06F 11/1469 |
| 2020/0147425 A1* | 5/2020 | Wright | | A62C 2/247 |
| 2020/0184107 A1* | 6/2020 | Troia | | G06F 12/1441 |
| 2020/0194083 A1* | 6/2020 | Wang | | G06F 3/0679 |
| 2020/0274422 A1* | 8/2020 | Murooka | | G01K 7/22 |
| 2020/0301764 A1* | 9/2020 | Thoresen | | G06F 9/45541 |
| 2020/0310687 A1* | 10/2020 | Huang | | G06F 3/0634 |
| 2021/0005229 A1* | 1/2021 | Hiscock | | G11C 7/20 |
| 2021/0005244 A1* | 1/2021 | Hiscock | | G11C 11/40611 |
| 2021/0026786 A1* | 1/2021 | Meier | | G11C 11/1695 |
| 2021/0090641 A1* | 3/2021 | Strand | | G11C 16/3427 |
| 2021/0257039 A1* | 8/2021 | Prakash | | G11C 16/3427 |
| 2021/0295919 A1* | 9/2021 | Shimura | | H10B 41/41 |
| 2021/0318822 A1* | 10/2021 | Sloat | | G06F 3/0634 |
| 2021/0375354 A1* | 12/2021 | Partsch | | G11C 7/1009 |
| 2021/0375357 A1* | 12/2021 | Li | | G06F 12/0246 |
| 2022/0012187 A1* | 1/2022 | Contreras Munoz | | G06F 21/44 |
| 2022/0068426 A1* | 3/2022 | Muchherla | | G06F 11/076 |
| 2022/0166762 A1* | 5/2022 | Srour | | G01R 1/28 |
| 2022/0362498 A1* | 11/2022 | Veschambre | | A61M 16/0003 |
| 2022/0412814 A1* | 12/2022 | G | | G01K 15/007 |
| 2023/0395115 A1* | 12/2023 | Visconti | | G11C 11/2275 |
| 2023/0420033 A1* | 12/2023 | Kim | | G11C 11/40611 |
| 2024/0012950 A1* | 1/2024 | Kang | | G06F 21/87 |

FOREIGN PATENT DOCUMENTS

| | | | | |
|---|---|---|---|---|
| CN | 108288482 A | * | 7/2018 | G06F 13/1636 |
| CN | 112132998 A | * | 12/2020 | |
| CN | 117216812 A | * | 12/2023 | |
| CN | 117254929 A | * | 12/2023 | |
| EP | 3161717 B1 | * | 7/2020 | G06F 21/10 |
| EP | 4174701 A1 | * | 5/2023 | G06F 21/602 |
| JP | 2022123479 A | * | 8/2022 | |
| KR | 2016077899 A | * | 7/2016 | |
| TW | 201506938 A | * | 2/2015 | G06F 3/06 |
| WO | WO-2014201059 A1 | * | 12/2014 | G06F 21/31 |
| WO | WO-2021155176 A1 | * | 8/2021 | G01R 31/085 |

\* cited by examiner

APPARATUS WITH POWER-BASED DATA PROTECTION MECHANISM AND METHODS FOR OPERATING THE SAME

TECHNICAL FIELD

The disclosed embodiments relate to devices, and, in particular, to semiconductor memory devices with power-based data protection mechanism and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

Until recently, nefarious activities (e.g., hacking, snooping, etc.) occurred at levels above the hardware layers. For example, hackers attempt to gain unauthorized access to data stored in the address via software-based methods, such as by duplicating/stealing passwords, using software tools (e.g., computer worms), etc. Newer activities are beginning to utilize lower-level (e.g., at device/component levels) interactions to gain unauthorized access to the apparatus. One such nefarious activity includes a boot attack in which the apparatus is removed from a system under certain conditions that preserve the operating state of the apparatus and/or the system. The removed device is then coupled to a nefarious system that is used to gain access to the preserved operating state and/or the corresponding information.

DETAILED DESCRIPTION

As described in greater detail below, the technology disclosed herein relates to an apparatus, such as memory systems, systems with memory devices, related methods, etc., for protecting data against hardware-level attacks. The apparatus (e.g., a memory device and/or a system including the memory device) can include a security mechanism (e.g., a voltage adjustment circuit) configured to adjust one or more internal processing voltages when non-operating conditions occur, such as when low environmental temperatures or other hardware-level attacking conditions are detected. The security mechanism may adjust the processing voltages to protect the operating states and/or stored data, such as by intentionally corrupting the states/data.

Figure 1:
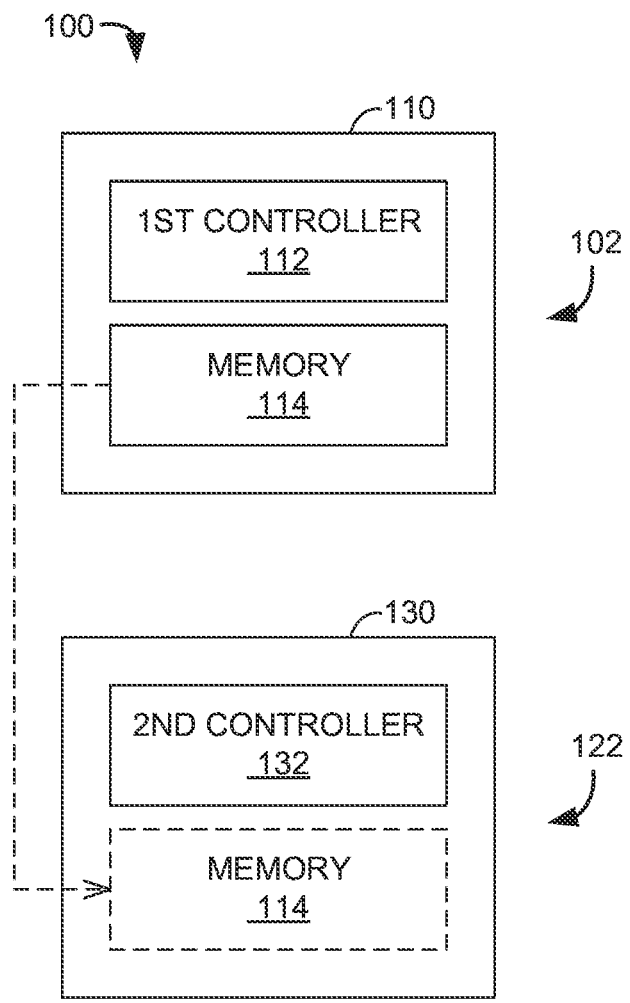
FIG. 1 is a schematic block diagram for a nefarious system including a conventional apparatus.

For illustrative purposes, one example of lower-level nefarious interactions is illustrated using FIG. 1. FIG. 1 is a schematic block diagram for a nefarious system 100 ("system 100"). The system 100 can include a first module 102 and a second module 122 configured to introduce a new/nefarious controller during operation of a memory component. Accordingly, the system 100 includes a first controller 112 for the first module 102 and a second controller 132 for the second module 122. In some embodiments, the first module 102 can include a first circuit board and/or subsystem 110 ("first subsystem 110") that simulate a computing environment that includes other devices/circuits (e.g., power supply, accelerators, etc.). Similarly, the second module 122 can include a second circuit board and/or subsystem 130 ("second subsystem 130") that simulate the computing environment (i.e., via the same set of devices/circuits or a different set) while replacing the first controller 112 with the second controller 132.

The unauthorized access to memory 114 (e.g., dual inline memory module (DIMM)) occurs by initializing the memory 114 with the first controller 112 (i.e., a normal controller circuit) and subsequently using the second controller 132 (i.e., a nefarious controller circuit) to access/control the memory 114. As such, the memory 114 can be "hot swapped" by being connected to a different set of devices (e.g., from the first module 102 to the second module 122) during operation of the memory 114. The operating states of the memory 114 can be preserved during the swap, such as by maintaining power, maintaining extremely low temperatures (e.g., below 0° C., below −40° C., etc.), and/or avoiding reinitialization of the memory 114. For example, a module freeze spray, a low temperature or a cryogenic environment (e.g., bath), and/or a switching circuit may be used to preserve the operating state of the memory 114 while swapping the DIMM across modules 102 and 122. Based on the swap, the conventional memory 114 may operate without detecting the change in the interfacing devices, and the second controller 132 may freely gain access to and control the memory 114.

To protect against such lower-level nefarious interactions, embodiments of the technology described herein may include a security mechanism configured to protect the operating states and/or stored data, such as by adjusting one or more processing voltages. For example, the security mechanism can adjust the processing voltages intentionally corrupting the corresponding operating states and/or data.

In some embodiments, the security mechanism can receive temperature readings from an existing on-die temperature sensor and/or logic. When the measured temperature reaches a threshold temperature outside of the operating range of the apparatus, the security mechanism can adjust an on-die voltage supply for a reference voltage (Vref) used to refresh data. For example, the security mechanism can drive the Vref to a low state, thereby causing all bits to be detected high. The change in data may occur based on the refresh rate (e.g., 64 ms cycles) and in less time (e.g., less than 100 ms) than required to enable/facilitate a nefarious system to access the same data. Accordingly, the security mechanism can leverage an existing process and existing circuits to protect the data against hardware-level attacks (e.g., cold boot attacks). Additionally or alternatively, the security mechanism can leverage other existing processes and/or circuits, such as by adjusting the word-line supply level, by forcing all cells to leak voltage, and/or by triggering a state machine or a separate process (e.g., built-in self test (BIST)) that alters the stored data.

Figure 2:
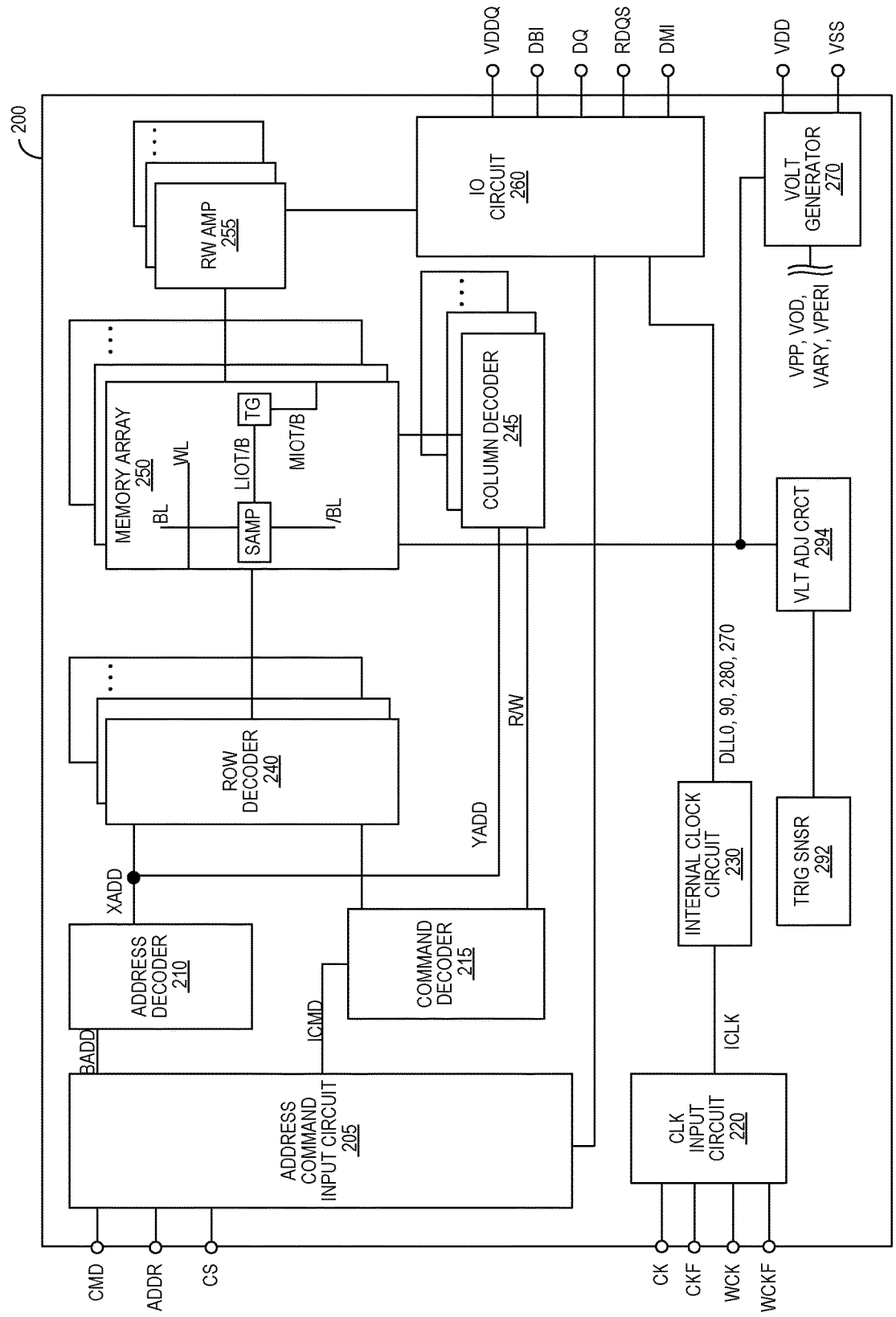
FIG. 2 is a block diagram of an apparatus in accordance with an embodiment of the present technology.

FIG. 2 is a block diagram of an apparatus 200 (e.g., a semiconductor die assembly, including a three-dimensional integration (3DI) device or a die-stacked package) in accordance with an embodiment of the present technology. For example, the apparatus 200 can include a DRAM or a portion thereof that includes one or more dies/chips.

The apparatus 200 may include an array of memory cells, such as memory array 250. The memory array 250 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The apparatus 200 may employ a plurality of external terminals that include command and address terminals coupled to a command bus and an address bus to receive command signals (CMD) and address signals (ADDR), respectively. The apparatus 200 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 2) from outside. The address signal and the bank address signal supplied to the address terminals can be transferred, via a command/address input circuit 205, to an address decoder 210. The address decoder 210 may receive the address signals and supply a decoded row address signal (XADD) to the row decoder 240, and a decoded column address signal (YADD) to the column decoder 245. The address decoder 210 can also receive the bank address signal and supply the bank address signal to both the row decoder 240 and the column decoder 245.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the apparatus 200 to respond to commands and addresses provided to the command and address terminals. When an active chip select signal is provided to the apparatus 200, the commands and addresses can be decoded and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The command decoder 215 may further include one or more registers for tracking various counts or values (e.g., counts of refresh commands received by the apparatus 200 or self-refresh operations performed by the apparatus 200).

Read data can be read from memory cells in the memory array 250 designated by row address (e.g., address provided with an active command) and column address (e.g., address provided with the read). The read command may be received by the command decoder 215, which can provide internal commands to input/output circuit 260 so that read data can be output from the data terminals DQ, RDQS, DBI, and DMI via read/write amplifiers 255 and the input/output circuit 260 according to the RDQS clock signals. The read data may be provided at a time defined by read latency information RL that can be programmed in the apparatus 200, for example, in a mode register (not shown in FIG. 2). The read latency information RL can be defined in terms of clock cycles of the CK clock signal. For example, the read latency information RL can be a number of clock cycles of the CK signal after the read command is received by the apparatus 200 when the associated read data is provided.

Write data can be supplied to the data terminals DQ, DBI, and DMI according to the WCK and WCKF clock signals. The write command may be received by the command decoder 215, which can provide internal commands to the input/output circuit 260 so that the write data can be received by data receivers in the input/output circuit 260, and supplied via the input/output circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the apparatus 200, for example, in the mode register. The write latency WL information can be defined in terms of clock cycles of the CK clock signal. For example, the write latency information WL can be a number of clock cycles of the CK signal after the write command is received by the apparatus 200 when the associated write data is received.

The power supply terminals may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in the sense amplifiers included in the memory array 250, and the internal potential VPERI can be used in many other circuit blocks.

The power supply terminal may also be supplied with power supply potential VDDQ. The power supply potential VDDQ can be supplied to the input/output circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 260 so that power supply noise generated by the input/output circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a clock/enable signal from the command decoder 215, an input buffer can receive the clock/enable signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable (not shown in FIG. 2) from the command/ address input circuit 205. For example, the internal clock circuit 230 can include a clock path (not shown in FIG. 2) that receives the internal clock signal ICLK and provides various clock signals to the command decoder 215. The internal clock circuit 230 can further provide input/output (IO) clock signals. The IO clock signals can be supplied to the input/output circuit 260 and can be used as timing signals for determining output timing of read data and/or input timing of write data. The IO clock signals can be provided at multiple clock frequencies so that data can be output from and input to the apparatus 200 at different data rates. A higher clock frequency may be desirable when high memory speed is desired. A lower clock frequency may be desirable when lower power consumption is desired.

The apparatus 200 can be connected to any one of a number of electronic devices capable of utilizing memory for the temporary or persistent storage of information, or a component thereof. For example, a host device of apparatus 200 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 200; although in other embodiments, the host device may be indirectly connected to memory device (e.g., over a networked connection or through intermediary devices).

The apparatus 200 can include a trigger sensor 292 configured to observe or measure targeted aspects of an operating environment (e.g., environmental parameters characteristic of a low-level or a hardware level attack). For example, the trigger sensor 292 can include a temperature sensor and/or logic configured to control various operational settings according to operating temperature, such as to account for temperature-based resistance changes, noise levels, signal degradations, etc. In some embodiments, the trigger sensor 292 can be configured to flag and identify when environmental or operating temperatures fall below a threshold temperature (e.g., below 0° C., below −40° C., etc.) that is outside of the operating temperature range of the memory device. The threshold temperature can be predetermined according to one or more aspects of the apparatus 200, such as the memory storage technology, circuit integrity, targeted industrial application, etc.

The apparatus 200 can include a security mechanism, such as a voltage adjustment circuit 294, configured to protect the operating state of the apparatus 200 and/or data stored/processed by the apparatus 200. In some embodiments, the voltage adjustment circuit 294 can adjust one or more voltage levels, such as by interacting with the voltage generator 270, the memory array 250, and/or other circuits described above. For example, the voltage adjustment circuit 294 can adjust a reference level (e.g., Vref) used for the data refresh and/or sense-amplifier operations. The voltage adjustment circuit 294 can adjust Vref, such as from the middle of two sense levels, to a low sense level or a high sense level. As a result, the stored information can be detected as the same value or bit level (e.g., all high when Vref is low or all low when Vref is high) during a read and/or a refresh operation. In other words, when a triggering condition is detected, the voltage adjustment circuit 294 can effectively drive/change all or a portion of the stored bits to a low state or a high state.

By adjusting Vref, the voltage adjustment circuit 294 can use the existing refresh operation to corrupt the data. Accordingly, the voltage adjustment circuit 294 can cause the data corruption within a response duration (e.g., less than 100 ms from detection of the triggering condition) that corresponds to the refresh rate (e.g., 64 ms). The resulting response duration can be less than the amount of time necessary to implement the hardware-level attack (e.g., such as to physically move the apparatus 200 from the first subsystem 110 of FIG. 1 to the second subsystem 130 of FIG. 1). Thus, the voltage adjustment circuit 294 can protect the stored data from being accessed by the nefarious system/ attack.

In other embodiments, the voltage adjustment circuit 294 can adjust the word-line supply voltage to corrupt the read data in response to detecting the targeted condition. Other examples of the protection mechanism can include circuitry configured to force all cells to leak stored charges and/or to trigger state machines or processes (e.g., BIST) that alter the stored data.

Figure 3:
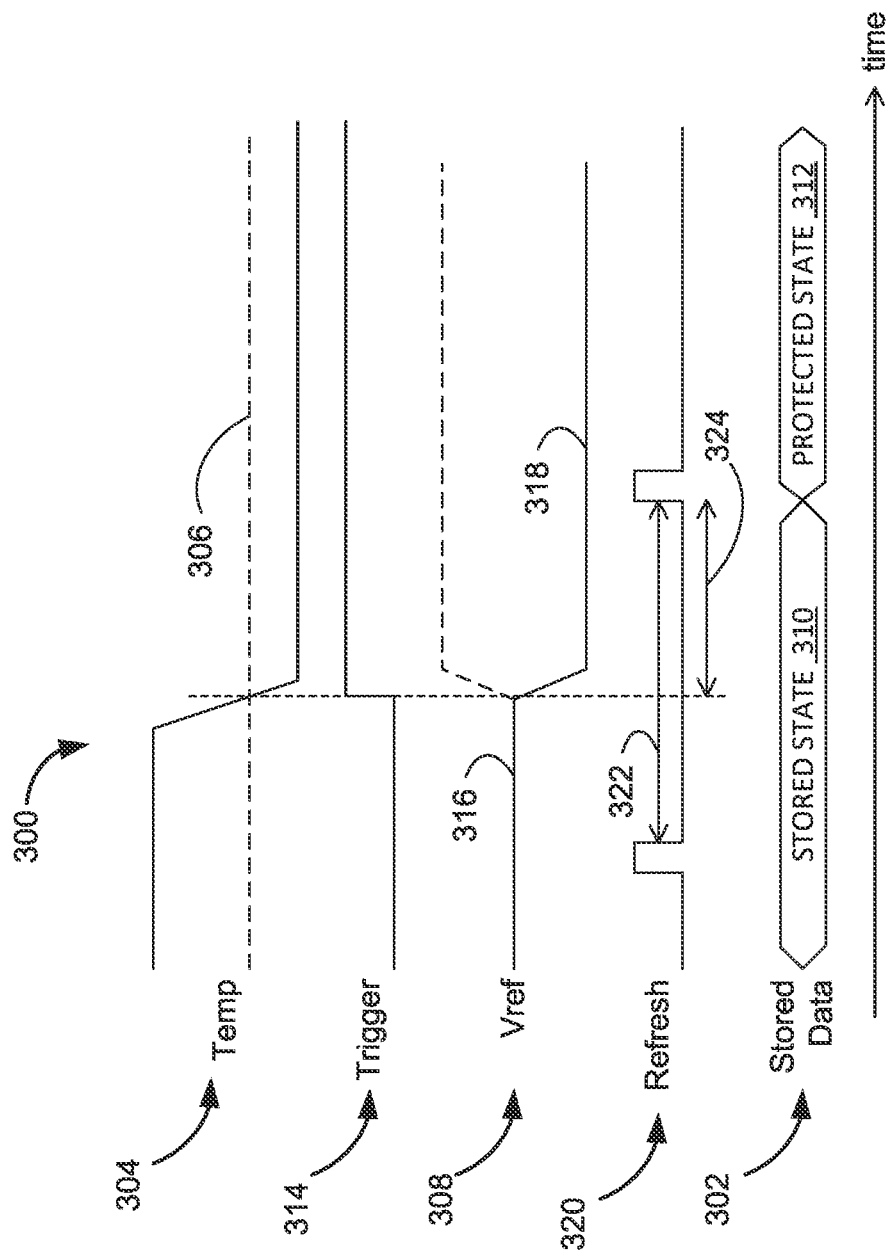
FIG. 3 is an example timing diagram for the apparatus of FIG. 2 in accordance with an embodiment of the present technology.

FIG. 3 is an example timing diagram 300 for the apparatus 200 of FIG. 2 in accordance with an embodiment of the present technology. The timing diagram 300 can represent one or more timings associated with the trigger sensor 292 of FIG. 2, the protection mechanism (e.g., the voltage adjustment circuit 294 of FIG. 2), and/or one or more circuits described above. The timing diagram 300 can represent the apparatus 200 (via, e.g., the voltage adjustment circuit 294) protecting a protection target in response to a change in an operating condition, such as by adjusting one or more processing voltages and/or implementing a protection process.

For the example illustrated in FIG. 3, the apparatus 200 can protect stored data 302 (e.g., data stored in the memory array 250 of FIG. 2) when a sensed temperature 304 meets or falls below a threshold level 306. The voltage adjustment circuit 294 can adjust a reference voltage 308 (Vref) used for sensing/determining bit values to change or intentionally corrupt the stored data 302 from a stored state 310 to a protected state 312. In some embodiments, an on-board temperature sensor (e.g., a portion of the trigger sensor 292 of FIG. 2) can provide the sensed temperature 304 and a logic (e.g., a different portion of the trigger sensor 292) can compare the sensed temperature 304 to the threshold level 306. When the sensed temperature meets or falls below the threshold level 306, the trigger sensor 292 can generate a trigger output 314. The voltage adjustment circuit 294 can receive and respond to the trigger output 314 by adjusting the reference voltage 308, such as by driving it from an operating level 316 (e.g., about midway between a high level and a low level that causes accurate reading of the stored state 310) to a protection level 318 (e.g., the low level or alternatively the high level). By adjusting the reference voltage 308 to the protection level 318, the voltage adjustment circuit 294 can leverage a refresh process 320 to implement the protection process. As a result of adjusting the reference voltage 308, the stored data 302 can be read back or detected as the protected state 312 (e.g., all high levels of stored charges due to low reference levels) during a subsequent refresh operation.

The voltage adjustment circuit 294 configured to update the reference voltage 308 and leverage the refresh process 320 to protect the data can use existing processes to guarantee data protection against hardware-level attacks. Since the memory device is configured to implement the refresh process 320 after a refresh delay 322 (e.g., 64 ms), the voltage adjustment circuit 294 can provide a response time 324 that is closely related to and bounded by the refresh delay. In other words, a maximum value of the response time 324 can correspond to the refresh delay 322 and any related processing durations. Since the combination of the refresh delay 322 and refresh processing durations (e.g., milliseconds) are many orders of magnitudes lower than the duration necessary to implement a hardware-level attack (e.g., seconds or minutes), the voltage adjustment circuit 294 can guarantee that the stored data 302 will be protected against such attacks.

Figure 4:
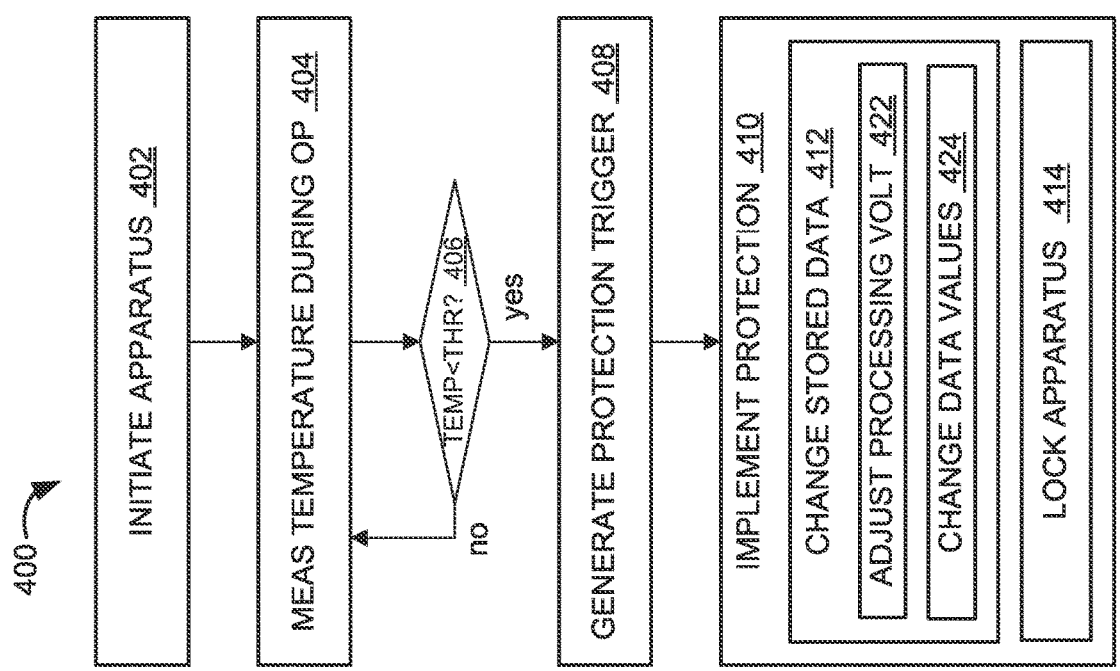
FIG. 4 is a flow diagram illustrating an example method of operating an apparatus in accordance with an embodiment of the present technology.

FIG. 4 is a flow diagram illustrating an example method 400 of operating an apparatus (e.g., the apparatus 200 of FIG. 2) in accordance with an embodiment of the present technology. The method 400 may correspond to the timing diagram 300 of FIG. 3. The method 400 can be for protecting an operating state of the apparatus and/or data associated with or stored in the apparatus.

At block 402, the apparatus can be initiated for operation. The apparatus can implement a boot process or a load process according to a predetermined set of instructions. Accordingly, the apparatus can prepare the functional circuitry (e.g., the memory array 250 of FIG. 2 and/or other circuits described above) for normal or intended operation.

At block 404, the apparatus can measure a temperature thereof during or as part of normal operation. The apparatus can use an on-board temperature sensor (e.g., a portion of a trigger sensor 292 of FIG. 2) to determine the sensed temperature 304 of FIG. 3 representative of a measurement of thermal energy in the apparatus and/or a surrounding environment thereof.

At decision block 406, the apparatus can compare the temperature to a threshold. The threshold can correspond to a predetermined temperature that is outside of a normal operating range of the apparatus. For example, the threshold can be at or below a floor/minimum temperature (e.g., 0° C., −40° C., etc.) of the operating range. When the temperature is at or above the threshold, the apparatus can continue the normal operation including measuring/monitoring the temperature. When the temperature falls below the threshold, the apparatus can generate a protection trigger based on the comparison, as illustrated at block 408. For example, the apparatus can use a portion of the trigger sensor 292 (e.g., a logic, a comparator, or the like) to generate the trigger output 314 of FIG. 3 when the temperature is below the threshold.

At block 410, the apparatus can implement the protection mechanism based on the trigger output. The apparatus can use a protection circuit to protect an operating state of the apparatus and/or data of the apparatus against an unauthorized access.

In some embodiments, as illustrate at block 412, the protection circuit can provide the protection by changing the data stored on the apparatus (e.g., by intentionally changing or corrupting the stored data or one or more portions thereof). The protection circuit can change the data or one or more portions thereof from the initially stored state 310 of FIG. 3 to the protected state 312 (e.g., a set of '0' bit values or a set of '1' bit values). The data may be changed based on adjusting a processing voltage as illustrated at block 422. For example, the protection circuit can include the voltage adjustment circuit 294 of FIG. 2 that changes the reference voltage 308 of FIG. 3 for the sense amplifier from the operating level 316 of FIG. 3 to the protection level 318 of FIG. 3 (e.g., a non-operational level outside of an operation range that is configured to accurately process the stored data). Also, the voltage adjustment circuit 294 can adjust other processing voltage, such as the word line supply voltage, to the non-operational level that would adjust or corrupt the stored data.

Additionally or alternatively, the apparatus can change data values as illustrated at block 424. The apparatus may change the data values by implementing a process that corresponds to the adjusted processing voltage. For example, the memory device can implement a data refresh operation (e.g., a regularly scheduled refresh occurring after the trigger) using the adjusted voltage reference. Accordingly, the memory device can change the stored data (e.g., the representative charge levels at the memory cells) to a predetermined state representative of a common bit value during a subsequently implemented refresh operation.

In some embodiments, the apparatus may change the data value independent of or without changing the processing voltage. For example, the apparatus can change the data values by implementing a BIST or a separate self-writing circuit to alter or replace the stored data. Accordingly, the apparatus can protect against an unauthorized system (e.g., the second subsystem 130 of FIG. 1) attempting to access the stored data, such as during a hardware-based attack (e.g., cold boot attack).

In addition to or instead of changing the data, the apparatus can implement the protection mechanism by locking the apparatus as illustrated at block 414. The apparatus can implement the lock, for example, based on implementing a self-initiated reset, disabling one or more circuits (e.g., the input/output circuit 260 of FIG. 2, the address command input circuit 205 of FIG. 2, or the like), and/or disabling one or more internal clocks. Accordingly, the apparatus can protect any configuration information or device operating status associated with the data storage against unauthorized access.

Figure 5:
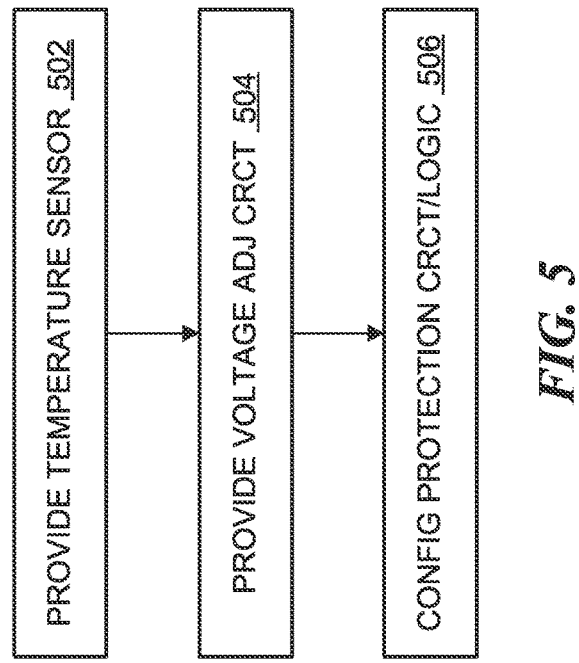
FIG. 5 is a flow diagram illustrating an example method of manufacturing an apparatus in accordance with an embodiment of the present technology.

FIG. 5 is a flow diagram illustrating an example method 500 of manufacturing an apparatus (e.g., the apparatus 200 of FIG. 2) in accordance with an embodiment of the present technology. For example, the method 500 can correspond to manufacturing a memory device that includes a protection circuit configured to protect an operating state of the memory device and/or data stored in the memory device.

At block 502, the method 500 can include providing a temperature sensor (e.g., a portion of the trigger sensor 292 of FIG. 2). The provided temperature sensor may include an onboard or on-die temperature sensor configured to measure a temperature of the apparatus and/or a surrounding environment thereof.

At block 504, the method 500 can include providing a voltage adjustment circuit (the voltage adjustment circuit 294 of FIG. 2 or a portion thereof). The voltage adjustment circuit can be configured to adjust one or more voltages, such as the reference voltage for the sense amplifier, a wordline supply voltage, or the like used to process the stored data. The voltage adjustment circuit can be configured to adjust the one or more voltages during a normal operation, such as to account for variations associated with process, voltage, and temperature (PVT), for accurately processing the stored data.

At block 506, the method 500 can include configuring a protection circuit/logic (e.g., a portion of the trigger sensor 292, a portion of the voltage adjustment circuit 294, or the like) to protect the apparatus against an unauthorized access thereto. The protection circuit can be configured to respond to the trigger output by changing the data values and/or locking the apparatus as described above. For example, the voltage adjustment circuit 294 and/or a corresponding logic can be configured to drive the reference voltage or the wordline supply voltage to non-operating levels that would change or intentionally corrupt the stored data during a corresponding data operation (e.g., refresh operation). Also, the self-test circuit, a self-write circuit, and/or a corresponding logic can be configured to separately alter the stored charge levels and the corresponding stored data to a predetermined pattern different from the initially stored content.

In some embodiments, providing one or more circuits for the method 500 can include forming the one or more circuits, such as using semiconductor manufacturing processes. For example, one or more of the circuits/logic described above can be formed in semiconductor material/substrate by doping the semiconductor, masking/etching to form connectors and/or isolation, or the like. Also, the circuits may be formed based on mounting one or more circuit components on a circuit substrate (e.g., a printed circuit board). The provided circuits can be electrically coupled to each other, such as using wired connectors (e.g., traces, buses, wires, etc.) and/or wireless mechanisms (e.g., inductor-based coupling). The provided circuits can be further coupled to other functional circuits, such as the memory array 250 of FIG. 2, the refresh circuit (not shown), a self-test circuit (not shown), and/or other circuits described above.

Figure 6:
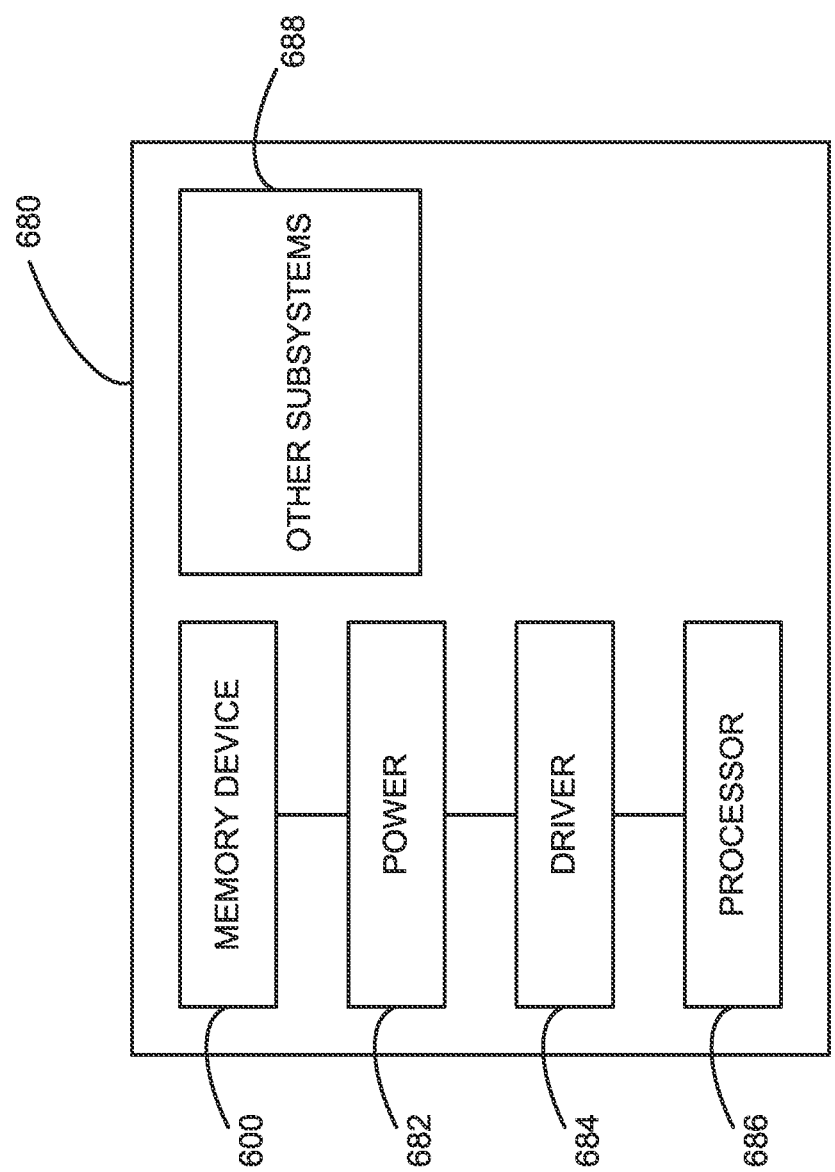
FIG. 6 is a schematic view of a system that includes an apparatus in accordance with an embodiment of the present technology.

FIG. 6 is a schematic view of a system that includes an apparatus in accordance with embodiments of the present technology. Any one of the foregoing apparatuses (e.g., memory devices) described above with reference to FIGS. 2-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the apparatus described above with reference to FIGS. 2-5, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 2-6.

I claim:

1. A memory device, comprising:
a memory array including rewritable memory cells configured to store data;
a temperature sensor configured to measure a temperature of the memory device;
a trigger logic coupled to the temperature sensor and configured to generate a trigger output when the temperature falls below a threshold level; and a data protection circuit coupled to the trigger logic and configured to protect the stored data from unauthorized access in response to the trigger output by changing the stored data or one or more portions thereof from an initially stored state to a different state through adjusting a processing voltage to a level outside of an intended operating voltage range configured to accurately process the stored data, wherein the processing voltage is voltage that is used during internal operations to read, write, and/or refresh data stored in the apparatus, wherein the data protection circuit includes a voltage adjustment circuit configured to protect the stored data by adjusting a processing voltage from an operational level to a protection level in response to the trigger output, wherein the protection level is outside of a range configured to accurately maintain the stored data, wherein the processing voltage is a reference voltage for a sense amplifier, the operational level is between a maximum high level and a minimum low level, and the voltage adjustment circuit is configured to adjust the reference voltage outside of the range and to or above the maximum high level or to or below the minimum low level in response to the trigger output for intentionally corrupting the stored data.

2. The memory device of claim 1, wherein the data protection circuit is configured to protect the stored data by altering the stored data to a protected state that includes different bit values than the stored data.

3. The memory device of claim 2, wherein data protection circuit is configured to alter the stored data by changing the stored data or a portion thereof to all '0' bit values or all '1' bit values.

4. The memory device of claim 1, wherein the voltage adjustment circuit is configured to adjust the reference voltage for a subsequent data refresh operation that uses the reference voltage to process the stored data or a portion thereof, wherein the adjusted reference voltage at the maximum high level or the minimum low level is configured to intentionally corrupt the stored data through the subsequent data refresh operation.

5. The memory device of claim 4, wherein:
the subsequent data refresh operation is a regularly scheduled refresh operation that occurs after the trigger output; and
the voltage adjustment circuit is configured to intentionally corrupt the stored data within a response time that corresponds to a refresh delay between implementations of the regularly scheduled refresh operation.

6. A memory device, comprising:
a memory array including rewritable memory cells configured to store data;
a temperature sensor configured to measure a temperature of the memory device;
a trigger logic coupled to the temperature sensor and configured to generate a trigger output when the temperature falls below a threshold level; and
a data protection circuit coupled to the trigger logic and configured to protect the stored data from unauthorized access in response to the trigger output by changing the stored data or one or more portions thereof from an initially stored state to a different state through adjusting a processing voltage to a level outside of an intended operating voltage range configured to accurately process the stored data, wherein the processing voltage is voltage that is used during internal operations to read, write, and/or refresh data stored in the apparatus, wherein the data protection circuit includes a voltage adjustment circuit configured to protect the stored data by adjusting a processing voltage from an operational level to a protection level in response to the trigger output, wherein the protection level is outside of a range configured to accurately maintain the stored data, and wherein the voltage adjustment circuit is configured to adjust, in response to the trigger output, word line supply voltage for a sense amplifier to the protection level that incorrectly processes and intentionally corrupts the stored data.

7. The memory device of claim 1, wherein the data protection circuit is configured to protect the stored data by initiating a built-in self-test (BIST) process in response to the trigger output to alter the stored data or a portion thereof.

8. The memory device of claim 1, wherein the memory device is a dynamic random-access memory (DRAM) device.

9. An apparatus, comprising:
a temperature sensor configured to measure a temperature of the apparatus;
a trigger logic coupled to the temperature sensor and configured to generate a trigger output when the temperature falls below a threshold level; and
a data protection circuit coupled to the trigger logic and configured to protect, in response to the trigger output, an operating state of the apparatus or rewritable client data stored therein against hardware-based unauthorized attempts to access the apparatus by adjusting a processing voltage to a level outside of an intended operating voltage range that is configured to accurately process the stored data, wherein the processing voltage is voltage used during internal operations to read, write, and/or refresh data stored in the apparatus, wherein the data protection circuit includes a voltage adjustment circuit configured to protect the data stored in the apparatus by adjusting a reference voltage in response to the trigger output, wherein the reference voltage is used to process the data and causes errors at a protection level.

10. The apparatus of claim 9, wherein:
the apparatus comprises a memory device that includes (1) a plurality of memory cells configured to store electrical charges representative of the data and (2) a sense amplifier configured to process the stored charges in accessing the stored data; and
the voltage adjustment circuit is configured to adjust the reference voltage for the sense amplifier, wherein:
the reference voltage is used to determine whether the charges stored in the memory cells represent a '0' bit or a '1' bit; and
the protection level of the reference voltage is configured to generate a constant '0' bit determination or a constant '1' bit determination regardless of the charges stored in the memory cells.

11. The apparatus of claim 9, wherein voltage adjustment circuit is configured to adjust the reference voltage used to refresh the stored data during a refresh operation, wherein the adjusted reference voltage is configured to corrupt the stored data during the refresh operation that follows the trigger output.

12. The apparatus of claim 9, wherein the threshold level is at or below a floor of an operating temperature range of the apparatus.

13. A method of operating a memory device, the method comprising:
    measuring a temperature of the memory device;
    comparing the temperature to a threshold level;
    generating a trigger output when the temperature is below the threshold level; and
    protecting a stored data from unauthorized access in response to the trigger output,
        wherein protecting the stored data includes changing the stored data or one or more portions thereof from an initially stored state to a different state by adjusting a processing voltage to a level outside of an intended operating voltage range configured to accurately process the stored data,
        wherein the processing voltage is voltage used during internal operations to read, write, and/or refresh the stored data, and
        wherein changing the stored data or the one or more portions thereof includes adjusting a processing voltage used to process the stored data, wherein the processing voltage is adjusted in response to the trigger output to a protection level that is outside of a range configured to accurately process the stored data.

14. The method of claim 13, wherein protecting the stored data includes changing the stored data or the one or more portions thereof from initially stored bit values to either a set of '0' bit values or a set of '1' bit values.

15. The method of claim 13, wherein adjusting the processing voltage includes adjusting a reference voltage for a sense amplifier to either a maximum high level or a minimum low level.

16. The method of claim 15, wherein changing the stored data or the one or more portions thereof includes implementing a refresh operation using the adjusted reference voltage to change the stored data or the one or more portions thereof to the different state.

17. The method of claim 16, wherein the refresh operation is an implementation of a regularly scheduled operation that occurs after the trigger output.

* * * * *